US007376199B1

(12) United States Patent
Nix (10) Patent No.: US 7,376,199 B1
(45) Date of Patent: May 20, 2008

(54) APPROACH FOR ADJUSTING THE PHASE OF CHANNEL-BONDED DATA

(75) Inventor: Michael A. Nix, Buda, TX (US)

(73) Assignee: Xilinx, Inc., San Jose, CA (US)

(*) Notice: Subject to any disclaimer, the term of this patent is extended or adjusted under 35 U.S.C. 154(b) by 665 days.

(21) Appl. No.: 10/931,166

(22) Filed: Aug. 31, 2004

(51) Int. Cl.
*H04L 27/00* (2006.01)
*H03K 9/00* (2006.01)

(52) U.S. Cl. .................................. 375/295; 375/316
(58) Field of Classification Search ............... 375/146, 375/226; 331/25; 327/41; 370/350
See application file for complete search history.

(56) References Cited

U.S. PATENT DOCUMENTS

| | | | | |
|---|---|---|---|---|
| 4,604,582 A | * | 8/1986 | Strenkowski et al. | 327/147 |
| 4,761,647 A | * | 8/1988 | Hallenbeck et al. | 340/825.22 |
| 4,864,303 A | * | 9/1989 | Ofek | 341/95 |
| 5,561,654 A | * | 10/1996 | Hamilton et al. | 369/97 |
| 5,703,502 A | * | 12/1997 | Grewal et al. | 327/3 |
| 6,735,731 B2 | * | 5/2004 | Ewen et al. | 714/733 |
| 6,897,699 B1 | * | 5/2005 | Nguyen et al. | 327/295 |
| 7,099,426 B1 | | 8/2006 | Cory et al. | |
| 2004/0268190 A1 | * | 12/2004 | Kossel et al | 714/704 |

OTHER PUBLICATIONS

U.S. Appl. No. 10/660,062, filed Sep. 11, 2003, Groen et al.
U.S. Appl. No. 10/660,448, filed Sep. 11, 2003, Groen et al.
U.S. Appl. No. 10/661,016, filed Sep. 11, 2003, Groen et al.
Xilinx, Inc.; U.S. Appl. No. 10/082,490 by Cory, filed Feb. 22, 2002.
Xilinx, Inc.; U.S. Appl. No. 10/622,204 by Cory, filed Jul. 18, 2003.
Xilinx, Inc.; U.S. Appl. No. 10/659,974 by Kryzak et al., filed Sep. 11, 2003.
Xilinx, Inc.; U.S. Appl. No. 11/036,495 by Kaszynski, filed Jan. 14, 2005.

* cited by examiner

*Primary Examiner*—David Payne
*Assistant Examiner*—Brian J Stevens
(74) *Attorney, Agent, or Firm*—LeRoy D. Maunu (57) ABSTRACT

An example embodiment is directed to an arrangement and method for phase-aligning digital data to be sent by transmit-data modules over respectively-situated serial links. A reference clock signal is communicatively coupled to each transmit-data module, each transmit-data module having a data driver and a clock circuit. At the serial links, each respective data driver sends digital data in response to a clock-output signal and a phase-adjusted clock-load signal that is used to load the data driver. The phase of the clock-load signal is adjusted relative to misalignment between the clock-load signal and the reference clock signal so that each data driver loads the digital data in a time-aligned manner for link transmission. The present invention is useful in applications involving programmable logic devices and other skew-susceptible parallel transmission arrangements.

12 Claims, 7 Drawing Sheets

APPROACH FOR ADJUSTING THE PHASE OF CHANNEL-BONDED DATA

FIELD OF THE INVENTION

The present invention relates generally to relatively high-speed data communication and, more particularly, to such communication over data channels that use multiple serial links to transfer data.

BACKGROUND OF THE INVENTION

Demands for high-speed data communication continue to push the electronics industry to develop faster and higher-functioning circuits, as has been realized in very-large-scale integration of circuits on small areas of silicon wafer. These complex circuits are often implemented as functionally-defined modules that operate to manipulate data presented for such high-speed transmission. The transmitted data can be passed in small or large amounts of data sets from these functionally-defined modules to various end points including, for example, a node dedicated to receive and process the data sets and a semi-open environment (such as a wired data bus) that provides access to one or more different nodes.

Whether these functionally-defined modules are implemented as stand-alone chips or in combination with other circuit arrangements (e.g., systems or subsystems), many applications for high-speed data communication are benefited by proper alignment of data, especially at the receiving end where the data is typically assembled for subsequent use. Data that is improperly aligned at the receiving end can present a data integrity issue that would typically require extraneous and time-consuming processing and/or unintelligible data.

The speed at which a given amount of data can be passed between two such communication nodes is referred to as "throughput." Many high-speed communication applications increase throughput by using parallel data transmission in which multiple data bits are simultaneously sent across parallel communication links. As an example of this approach, one such parallel-communication system would separate the data in each set for loading into transmission-link drivers that feed the loaded data onto respective parallel communication links. In this context, the parallel communication links carry the data from the respective transmission-link drivers to respective link receivers for reassembly of the separated data into the original data sets.

In some applications, the channel includes a separately-transmitted signal (such as a reference clock) to the transitions over the parallel signal lines leaving the sending module in a synchronous relationship with each other and/or to the clock on the sending module. At the other end of the parallel data interconnect, the data is received along with a clock signal; the receive clock is typically derived from or is synchronous with the clock on the sending module. The rate at which the data is passed over the parallel signal lines is sometimes referred to as the (parallel) "bus rate."

In such systems, proper data recovery is typically obtained by ensuring that the signals received over each communication link (which signals represent the transmitted data) have a specific phase relationship relative to the intended phases of data carried by the other links. Systems designed to communicate data at relatively high speeds are often designed to allow for a certain amount of "skew" from the time at which the parallel data is transmitted and the time at which the data signals are received. There are many sources of skew including, for example, transmission delays inherently introduced in each line due to impedance factors, circuit variations and signal delays in the I/O (input/output) drivers and receivers, and intersymbol interference. Typically, the potential for this undesirable skew increases with increases in line transmission rate.

Programmable devices are a class of general-purpose integrated circuits that, when configured for such high-speed data transmission applications, can present an accentuated potential for skewed data. Such programmable devices, whether mask programmable or field programmable, can be classified as programmable memory devices or programmable logic devices. Field programmable gate arrays (FPGA) have become very popular for telecommunication applications, Internet applications, switching applications, routing applications, et cetera. Generally, an FPGA includes a programmable logic fabric and a programmable input/output section. The programmable logic fabric may be programmed to perform a wide variety of functions corresponding to the particular end-user applications. The programmable input/output section provides the high-speed data transmission.

The programmable input/output section is fabricated on the perimeter of a substrate supporting the FPGA and provides coupling to the pins of the integrated circuit package allowing users access to the programmable logic fabric. Typically, the programmable input/output section includes a number of serial/deserial transceivers to provide access to the programmable logic fabric. Such transceivers include a receiver section that receives incoming serial data and converts it into parallel data and a transmitter section that converts outgoing parallel data into an outgoing serial data stream.

The transceivers of the I/O section often use a different clock domain than the programmable logic fabric. As the speed of the incoming and outgoing serial data increases well into the gigabit-per-second range, the separate clock domains of the input/output section and the programmable logic fabric can present a synchronization problem between the two sections that, in turn, can cause corruption of data.

One approach for addressing this issue is to rely on a reset-signal in each serial line of a channel-bonded set to set the phase of the clock divider circuit. Due to the large distance between the serializer/deserializer (SerDes) transceivers that are typically used to communicate a channel-bonded data, and a synchronization of the reset-signal to the local high-speed clock, the best phase alignment that can be accomplished is plus or minus two clock cycles.

For many present and future applications involving programmable devices and other types of skew-susceptible parallel transmission arrangements, with regard to its integrity and/or overall throughput, data communication can benefit from different phase alignment approaches.

SUMMARY OF THE INVENTION

Various aspects of the present invention are directed to applications that would benefit from high-speed transfer of data sets using parallel-line, channel-bonded communication. Implementations of the present invention are intended to serve such applications in a manner that addresses and overcomes the above-mentioned issues as well as others.

According to one embodiment, the present invention is directed to an arrangement and method for phase-aligning data to be sent by transmit-data modules over respectively-situated serial links. With this approach, a reference clock signal is communicatively coupled to each transmit-data module. At each of the multiple serial links, data drivers send the transmit-data module in response to a clock-output signal, and the respective phases for loading the data drivers are adjusted relative to the reference clock signal.

According to a related embodiment, the present invention is directed to a circuit arrangement that uses a reference clock signal that is also common to each of the transmit-data modules for phase-aligning data to be sent over the respective serial links. For each of the multiple serial links, a transmit-data module includes a data driver and a clock circuit. Each respective data driver sends digital data in response to a clock-output signal and a phase-adjusted clock-load signal that is used to load the data driver. The phase of the clock-load signal is adjusted relative to misalignment between the clock-output signal and the reference clock signal so that each data driver loads the digital data in a time-aligned manner for link transmission.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be generally applicable to high-speed data communication applications involving a data channel that uses multiple serial links to send information from one point to another. The invention has been found to be particularly advantageous for high-speed data communication applications requiring or benefiting from increased alignment of the data at the transmitting end of the data channel. Examples of such applications include those implemented using general-purpose integrated circuits and programmable logic devices. While the present invention is not necessarily limited to such applications, an appreciation of various aspects of the invention is best gained through a discussion of examples in such an environment.

According to one example embodiment of the present invention, a parallel data communication arrangement uses multiple serial links as a data channel. Data from a data set is presented to the data channel via link drivers. The link drivers use a common reference clock signal, and associated with each respective link driver is a transmit-data module that uses the reference clock signal so that the data sent from the link drivers is phase aligned. For each of the serial links, the transmit-data module includes a data driver that sends data in response to a clock output signal having a phase that can be controlled as a function of an input clock having a substantially higher clock rate. In one particular embodiment, the phase of the clock output signal is controlled by suspending the input clock for at least a cycle of the input clock when the reference clock signal and the clock output signal are misaligned.

In another particular embodiment, the phase of the clock output signal is controlled in response to such misalignment by disabling the circuit that generates the clock output signal for a portion of the input clock (e.g., 1 or 2 rising edges) to retard the phase of the output clock signal. For example, a clock-divider circuit can be used to provide the clock output signal as a division of the input clock; in this example, the operation of the clock-divider circuit is disabled to suspend the clock output signal temporarily. It will be appreciated, however, that the clock output signal does not need to be a function of the input clock; rather, other embodiments employ an independent clock source to provide the relatively high-speed input clock.

In a related embodiment, this suspension is for one cycle of the input clock for each cycle of the reference clock signal when the reference clock signal and the clock-divided signal are misaligned.

Figure 1:
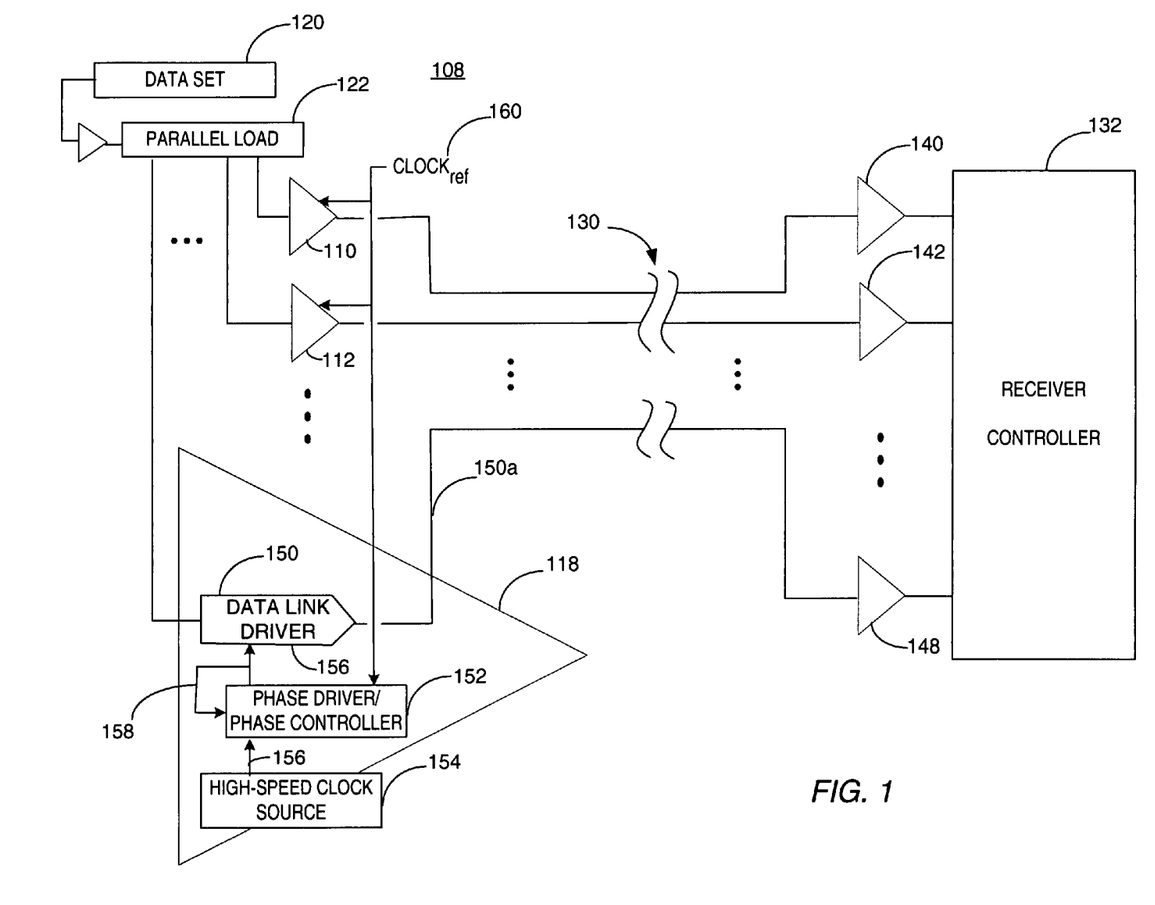
FIG. 1 is a schematic block diagram of a more general data-communication arrangement in accordance with the present invention.

Consistent with the above-described embodiments, FIG. 1 is a schematic block diagram of a communication arrangement 108 that illustrates an expanded view of a representative one of a plurality of transmit-data modules 110, 112 through 118. Generally, these transmit-data modules 110, 112 through 118 are bonded together to form a communication channel 130 ("channel bonded") that carries data from a transmit node to a receive node, as respectively depicted by the transmission and reception circuitry on either side of the channel 130. While FIG. 1 shows only one-way communication from the transmission circuitry, as exemplified below with FIG. 2, it will be appreciated that similar circuitry can be implemented and controlled in a reciprocal communication path, thereby effecting two-way communication.

The transmit node uses the channel 130 to send data representing a data set (e.g., as originally stored in a data set register 120 or in independent circuits for providing the data separately) at a higher data rate than could be provided using one serial data line. Assuming that data set register 120 is used, the data set is provided to a parallel load module 122 which responds to a clock-load signal to present data from the set in parallel for loading into line drivers within each of the channel-bonded transmit-data modules 110, 112 through 118. Each of the transmit-data modules 110, 112 through 118 is adapted to phase align this presented data so that when the data is received by receiver-data modules 140, 142 through 148 (at the other end of the channel 130), a receiver control module 132 can more readily reassemble the data into the original data set, for example, as represented in the register 120.

In accordance with the present invention, this phase-alignment approach at the transmission side of the channel 130 can enhance any phase-alignment being used at the receiver side of channel 130. For example, in certain applications, the receiver-data modules 140, 142 through 148 may have respective phase-locked loop (PLL) receiver circuits used to detect and phase align to the edges of the serially-received data segments. These individual receiver circuits cannot be aligned to one another from start-up because each has a separate PLL for clock recovery. Clock recovery at the receive end can be expedited according to the present invention, for example, by sending a known set of phase-aligned data across the channel at start up. Moreover, after each such conventional PLL receiver circuit would eventually lock to its incoming serial data with the corresponding phase being known, by providing phase alignment of the data at the transmitting side of the channel 130, the phase of the recovered-clock that is used to transfer parallel data from the receiver-data modules to the receiver controller 132 module is readily obtained.

As exemplified using representative transmit module 118, this phase-alignment approach is implemented using a line driver 150 adapted to drive data over line 150*a*, a clock-manipulator 152 and a clock source 154. The clock source 154 provides a relatively high-speed clock signal 156 as a primary input to the clock-manipulator 152 and for driving the output of the line driver 150. The clock-manipulator 152 provides a largely-conventional clock division function by reducing high-speed clock signal 156 to a desired clock output 158 for loading of data to be transmitted via the line driver 150.

Between the respective line drivers of each transmit module, phase alignment is provided by controlling the phase of the clock output 158 relative to a reference clock 160 that is similarly used by each of the transmit modules. The phase of the load signal (clock output 158) to the data link driver 150 is controlled in response to misalignment between the clock output 158 and the reference clock 160 by disabling the clock-divider circuit to delay, or retard, the phase of the clock output 158. This delay can be implemented in various ways including those discussed above, for example, by suspending the clock output 158 for one cycle of the input clock 156 for each cycle of the reference clock 160 when the reference clock 160 and the divided clock output 158 are misaligned. Accordingly, at each of the transmit modules, whenever the respective clock output 158 is not aligned to the common reference clock 160, the transmit module delays respective clock output 158 to improve alignment of the data sent over the channel 130.

Figure 2:
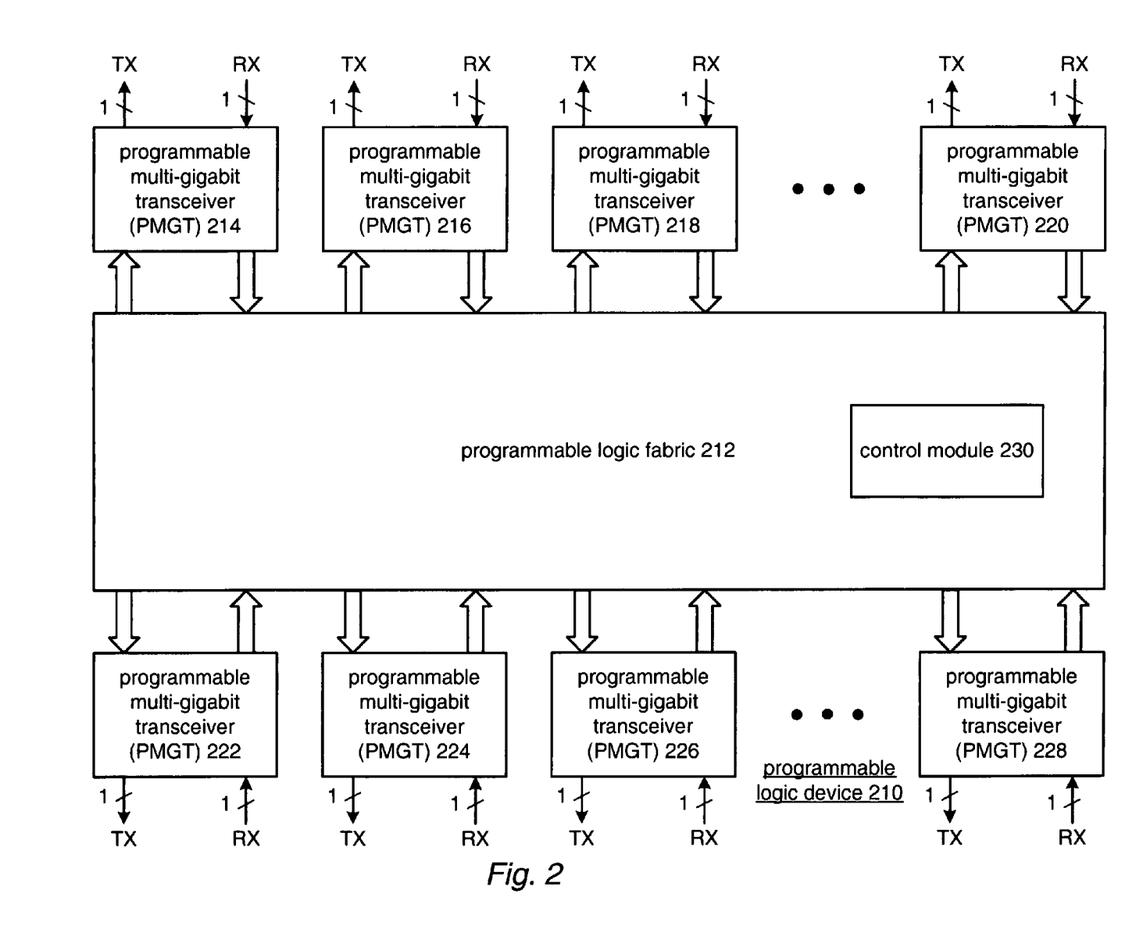
FIG. 2 is a schematic block diagram of a programmable logic device including multi-gigabit transceivers in accordance with a specific example of the present invention.

FIG. 2 is a schematic block diagram of a programmable logic device 210, according to the present invention, with such transmit-data modules that provide the above-described phase-aligned data communication. The programmable logic device 210 includes programmable logic fabric 212, programmable multi-gigabit transceivers (PMGT) 214-228 and a control module 230. As examples of various applications, the programmable logic device 210 may be a programmable logic array device, a programmable array logic device, an erasable programmable logic device, and/or a field programmable gate array (FPGA). When the programmable logic device 210 is a field programmable gate array (FPGA), the programmable logic fabric 212 may be implemented as a symmetric array configuration, a row-based configuration, a sea-of-gates configuration, and/or a hierarchical programmable logic device configuration. The programmable logic fabric 212 may further include at least one dedicated fixed processor, such as a microprocessor core or digital signal processor (DSP), to further facilitate the programmable flexibility offered by a programmable logic device 210. In this schematic of FIG. 2, the programmable multi-gigabit transceivers (PMGT) 214-228 include a data-receiving circuit and a data-transmission circuit, the latter of which includes the above-discussed transmit-data module.

The control module 230, which may be contained either within the programmable logic fabric 212 or within each of the transceivers 214-228, generates the control signals to program the transmit and receive sections of the transceivers 214-228. In general, the control module 230 and the transceivers 214-228 send a set of data by presenting the data set in parallel form to each of the programmable multi-gigabit transceivers 214-228. Depending on the communication format and the number of data links to be used as the data channel, a selected set of the programmable multi-gigabit transceivers 214-228 is used to transmit the presented data (representing at least part of the data set) to another node (not shown in FIG. 2) configured with a compatible communication format. As typical examples, the number of links (or programmable multi-gigabit transceivers 214-228) used to transmit the presented data corresponds to the width of the data channel; in this context, where the width of the data channel is 8-bits (or 16-bits, 32-bits, 64-bits, etc.), the number of links is 8 (or 16, 32, 64, etc.). Typically, the serial data will be a 1-bit stream of data that may be a binary level signal, multi-level signal, etc.

Accordingly, two or more of the programmable multi-gigabit transceivers are channel bonded and cooperatively-adapted so that the data sent from each is phase-aligned in accordance with the present invention. For example, if multi-gigabit transceivers 214, 216 and 218 are transceiving data at 3.125 gigabits-per-second, these transceivers may be bonded together such that the effective serial rate is 3 times 3.125 gigabits-per-second with the data being phase-aligned to facilitate integrity and recovery of the data sets.

With fewer than all of the programmable multi-gigabit transceivers 214-228 being bonded together, the remaining transceivers may be individually programmed, or channel bonded into one or more sets, to conform to separate standards. In addition, the transmit path and receive path of each multi-gigabit transceiver 214-228 may be separately programmed such that the transmit path of a transceiver is supporting one standard while the receive path of the same transceiver is supporting a different standard. Further, the serial rates of the transmit path and receive path may be programmed from 1 gigabit-per-second to tens of gigabits-per-second. The size (or width) of the parallel data in the transmit and receive sections, or paths, is also programmable and may vary.

Figure 3:
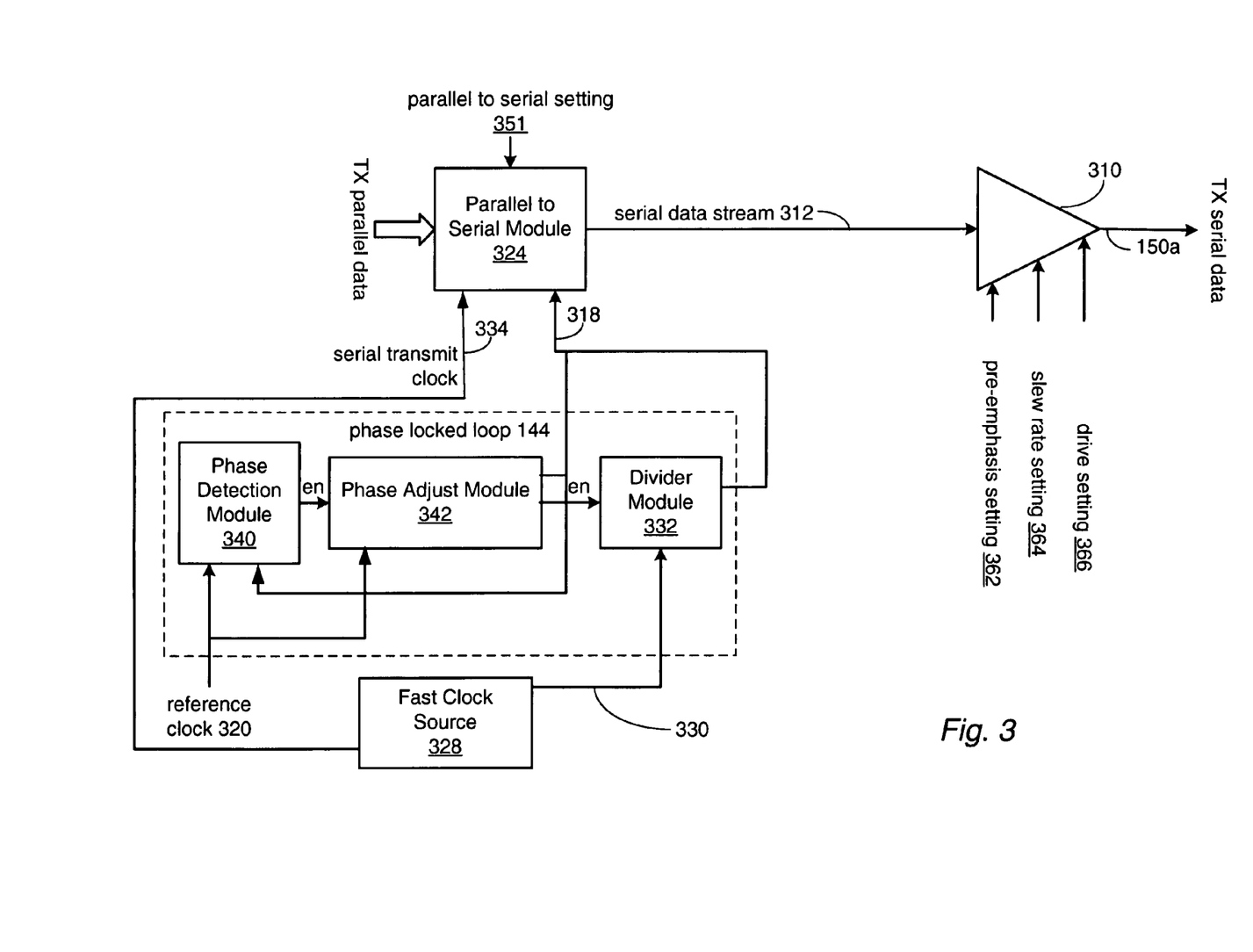
FIG. 3 is a schematic block diagram of a transmit module in accordance with the present invention.

FIG. 3 illustrates a schematic block diagram of a programmable transmit module that can be used to implement the transmit portion of each transceiver shown in the PLD 210 of FIG. 2. For details regarding applications and specific embodiments of the PLD 210 of FIG. 2, including the receiver portion of each PLD transceiver, reference may be made to U.S. patent application Ser. No. 10/661,016, filed on Sep. 11, 2003 entitled, *Programmable Logic Device Including Programmable Multi-Gigabit* Transceivers by Eric D. Groen et. al., which is herein incorporated by reference.

Consistent with the communication channel shown in connection with FIGS. 1 and 2, the programmable transmit module of FIG. 3 includes a line driver 310 for transferring data bits (from a serial data stream 312) to line 150a which is also shown in FIG. 1. The line driver 310 aligns the data for line 150a with data to be sent by similarly-situated line drivers (not shown in FIG. 3) by aligning a parallel-load clock 318 with a relatively-slow reference clock 320 which is common to each of the transmit-data modules. At the same time and phase-referenced to the reference clock 320, within each respective transmit-data module, the parallel-load clock 318 is used to load a parallel-to-serial module 324, so that the parallel data is transmitted by the cascaded line drivers 310 at the same time.

In this particular embodiment, the extent to which data can be sent "at the same time" is limited by the period of the fast-clock signal that is provided by a fast-clock source 328. The fast-clock source 328 provides a relatively-fast input clock signal 330 to a divider module 332, and another clock signal 334 for feeding the front end of the parallel-to-serial module 324 and keeping transmission data available for triggers by the parallel-load clock 318. For loading the parallel-to-serial module 324, subject to adjustment effected by phase-control circuitry, the divider module 332 generates the parallel-load clock 318 in response to the input clock signal 330 as would a conventional clock divider circuit providing a straight-forward clock division function.

Referring to the adjustment effected by phase-control circuitry, a phase detection module 340 and a phase adjust module 342 are used to modify the otherwise normal functionality of the clock divider module 332. The clock divider module 332 includes an enable/disable circuit (e.g., using a simple two-input logic gate) adapted to disable (or suspend) the input clock signal 330 from cycle advancing the state operation of the clock divider module 332. The phase adjust module 342 provides this enable/disable signal for one period of the fast-clock signal 330 for each cycle of the reference clock 320 when the reference clock 320 and the signal 318 are misaligned. The phase detection module 340 informs the phase adjust module 342 when the reference clock 320 and the clock-output signal are misaligned by comparing the edges of the reference clock 320 with the edges of signal 318, the latter signal being fed back to the phase detection module 340 for this purpose.

In one application, the input clock signal 330 is at least 10 times the rate of the parallel-load clock 318 which, in turn, is at least 10 times the rate of the reference clock 320. It will be appreciated that these relative rates can vary widely and depend on the alignment accuracy desired for the given application.

Various aspects of the transmit module of FIG. 3 are adapted to provide programmable settings as an option. The parallel-to-serial module 324, for example, can receive a setting that defines the number of parallel bits to be converted into an elastic buffer that is internal to the module 324 and to indicate the rate of the transmit parallel data per the clock signals 334 and 318. The line driver 310 can receive a drive-level setting 366 to adjust the power of the serial transmit data, a slew rate setting 346 and a pre-emphasis setting 362. Other settings are realized as may be discussed in the above-referenced patent document.

Further details on the line driver 310 are described in co-pending U.S. patent application Ser. No. 10/660,062, filed Sep. 11, 2003 by Eric D. Groen et al. entitled, "Dac Based Driver With Selectable Pre-Emphasis Signal Levels", and in co-pending U.S. patent application Ser. No. 10/660, 448, filed Sep. 11, 2003 by Eric D. Groen entitled, "Tx Line Driver With Common Mode Idle State And Selectable Slew Rates". These two co-pending applications are incorporated by reference herein.

Figure 4:
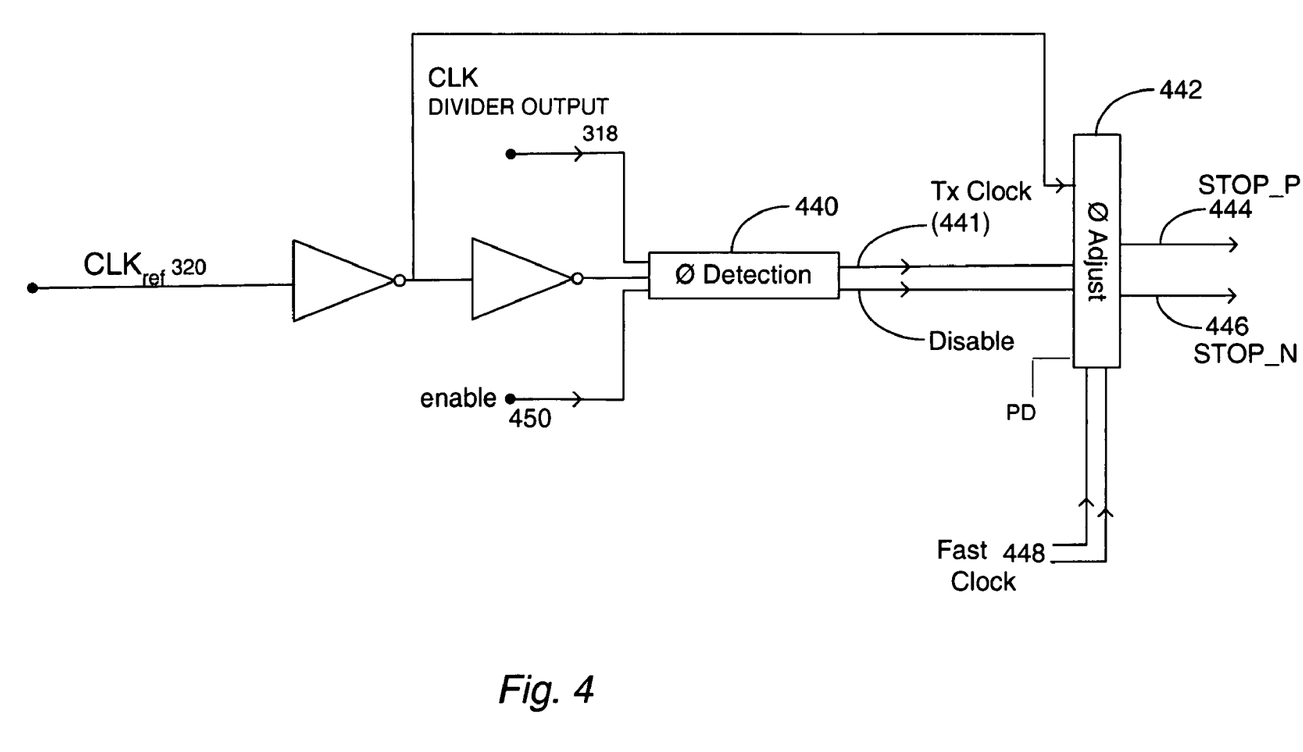
FIG. 4 is a schematic block diagram showing an example approach for implementing circuitry shown in FIG. 3 and including phase detection and phase adjustment circuitry, also in accordance with the present invention.

FIG. 4 is a schematic block diagram showing an example approach for implementing the phase detection module 340 and the phase adjustment module 342 of FIG. 3. As with FIG. 3, a phase detection module 440 and a phase adjust module 442 are used to modify the otherwise normal functionality of a clock divider module (332 FIG. 3) by providing an enable/disable signal at nodes 444 and 446. The phase adjust module 442 provides this enable/disable signal for one period of the fast-clock signal (at node 448) for each cycle of the reference clock 320 when the reference clock 320 and the signal 318 are misaligned. The phase detection module 440 informs the phase adjust module 442 of this misalignment by comparing the edges of the reference clock 320 with the edges of the signal 318, as with the circuit shown in FIG. 3.

Figure 5:
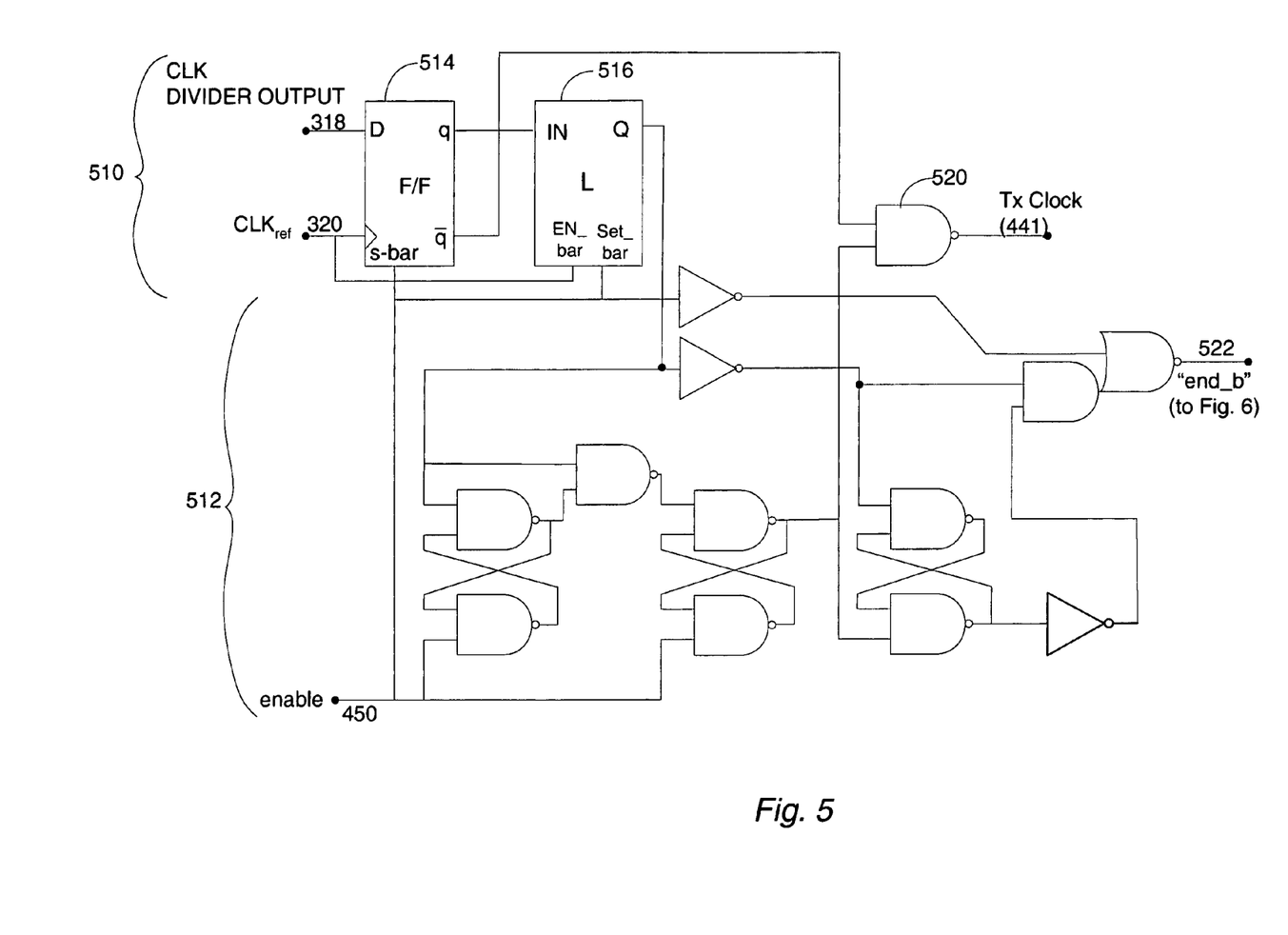
FIG. 5 is a schematic block diagram showing an example approach for implementing phase detection circuitry shown in FIG. 4, also in accordance with the present invention.

FIG. 5 is a schematic block diagram showing an example approach for implementing the phase detection module 440 of FIG. 4. The example shown in this detailed embodiment includes a clock comparison circuit 510 and a state machine 512. The clock comparison circuit 510 includes a D-type flip-flop 514 adapted to compare the phase of the clock-divider output signal 318 with the clock reference signal 320; if the states of the signals 318 and 320 are different, the q-output of the D-type flip-flop 514 is latched (latch 516) so that one clock cycle is skipped for each such occurrence. The latch 516 has its S/R inputs connected to signal 320 and an enable signal 450 (also in FIG. 4). In this manner, the latch 516 provides a reliable signal for the clock comparison generated by the D-type flip-flop 514.

The state machine 512 can be used to prevent adjustments to the clock output (441 of FIG. 4) from being passed to the phase adjust module 442 when alignment is detected. As illustrated in this circuit diagram, the state machine 512 can also be used to prevent undesirable states (and/or pulses) from appearing on the signals 441 and 522. Alternatively, the embodiment shown in FIG. 5 can run continuously with the clock comparison circuit 510 passing the clock output 441 (via NAND gate 520) without interruption. The state machine 512 provides an enable ("end_b") signal 522 to enable the phase adjustment module (e.g., 342 of FIG. 3).

Figure 6:
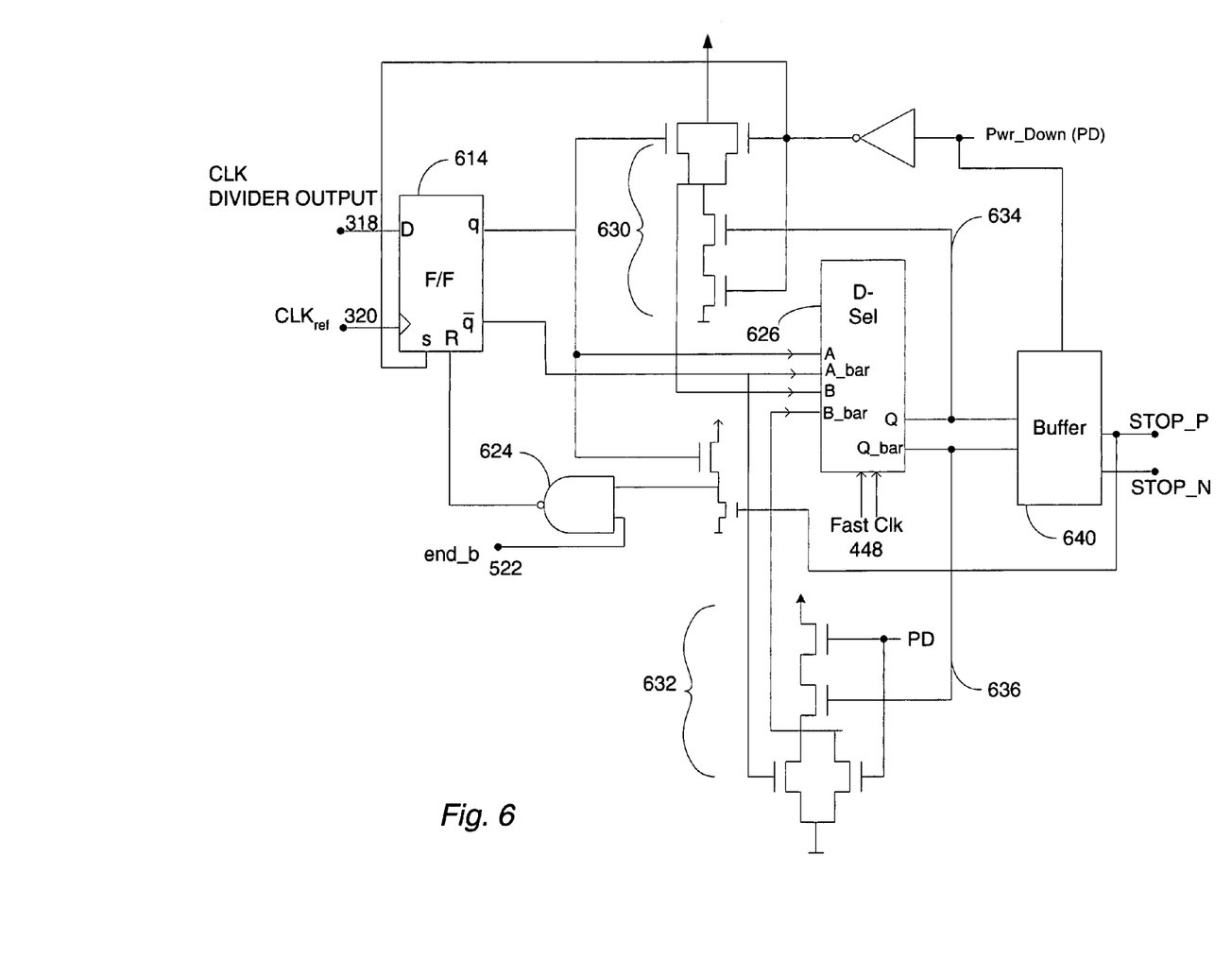
FIG. 6 is a schematic block diagram showing an example approach for implementing phase adjustment circuitry shown in FIG. 4, also in accordance with the present invention.

FIG. 6 is a schematic block diagram showing an example approach for implementing the phase adjustment module 442 shown in FIG. 4. D-type flip flop 614 operates in accordance with the D-type flip flop 514 of FIG. 5 by comparing the phases of the signals 318 and 320. Using the "end_b" signal 522 and NAND gate 624, this D-type flip flop 514 is cleared after each delay is detected by the phase detect circuit of FIG. 5. The D-type circuit 626 acts to multiplex either the clock divider output 318, as passed through the D-type flip flop 614, or (for the phase adjustment) a delayed version of its own output via the high-speed transistor logic 630 and 632 provided in feedback paths 634 and 636. A buffer circuit 640 provides the output clock for the clock divider stage, as discussed below in connection with FIG. 7.

Figure 7:
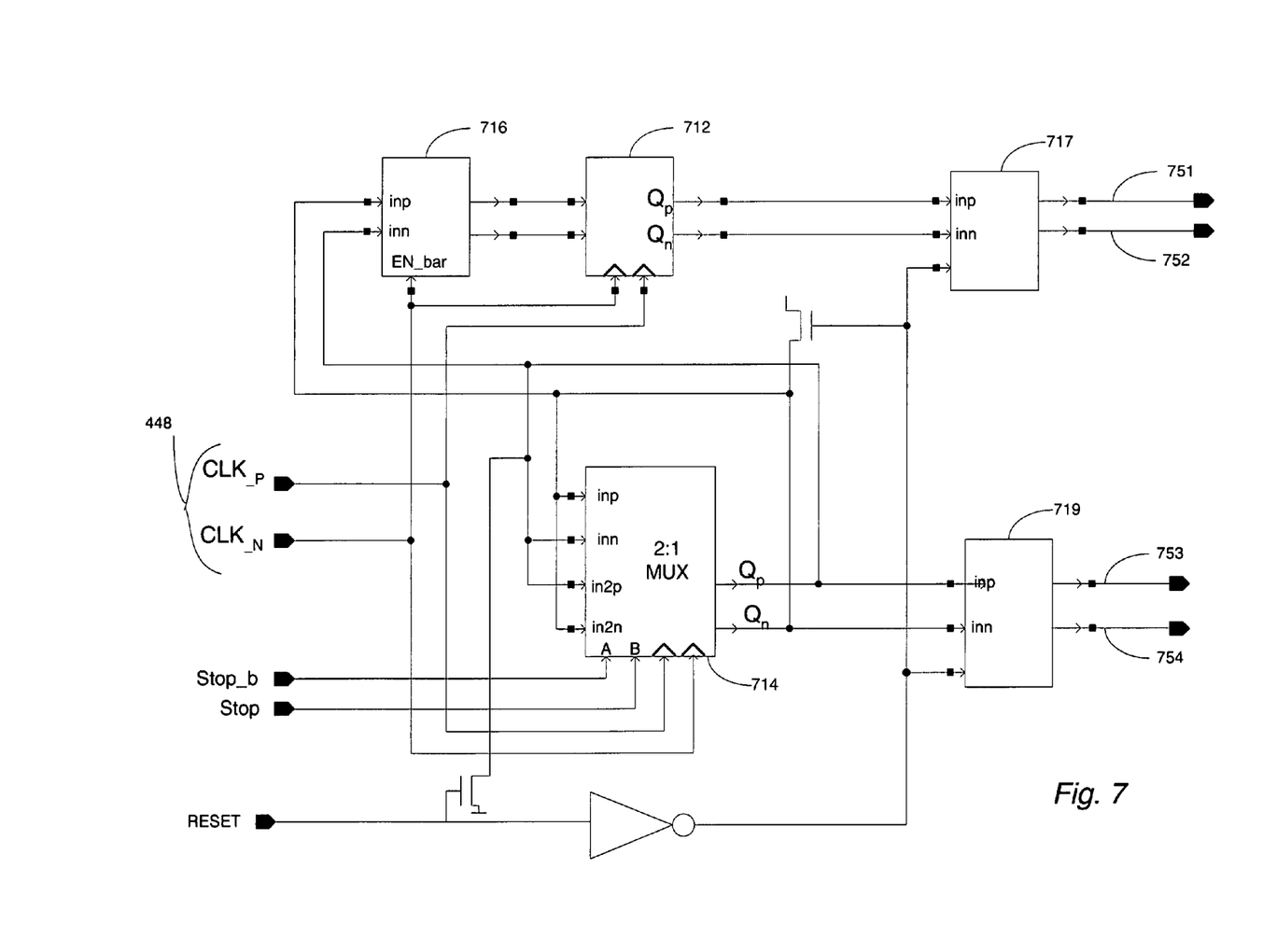
FIG. 7 is a schematic block diagram showing an example approach for implementing a divider circuit shown in FIG. 4, also in accordance with the present invention.

FIG. 7 is a schematic block diagram showing an example approach for implementing divider module 332 of FIG. 3. The high-speed input clock ($CLK_{IN}$) 448 is shown as having positive and negative polarity for driving similarly-constructed master/slave D-type flip flops 712 and 714, and with the negative polarity used to enable a latch 716. The inputs to the latch 716, as well as the inputs of the D-type flip flop 714, are generated by the data outputs of the D-type flip flop 714. The inputs to the D-type flip flop 712 are generated by the data outputs of the latch 716. The construction of the D-type flip flops 712 and 714 differ only in that the D-type flip flop 714 has power-down/reset control provided by a reset signal.

The divide-by operation is recognizable in FIG. 7 from a functional perspective. The D-type flip flop 714 performs the conventional divide-by-2 operation. The latch 716 and the D-type flip flop 712 provide a ½-cycle delay (relative to the period of the input clock 710 at its falling edge) that is used by master/slave D-type flip flops 712 and 714 to generate the quadrature signals 751, 752, 753 and 754 via buffers 717 and 719. These quadrature signals can be used to drive further stages (to provide any divide-by function) as illustrated and described in commonly assigned, co-pending U.S. patent application Ser. No. 10/909,800, filed on Jul. 30, 2004 entitled, "Frequency Division of an Oscillating Signal Involving a Divisor Fraction" by Michael A. Nix, which is herein incorporated by reference.

As one of ordinary skill in the art would appreciate, other embodiments may be derived from the teaching of the present invention without deviating from the scope of the claims.

What is claimed is:

1. For sending digital data representing a data set, using multiple serial links, a circuit arrangement for aligning the phases of the digital data at a transmission end of the multiple serial links, comprising:
    a reference clock signal;
    for each of the multiple serial links, a transmit-data module communicatively coupled to the reference clock signal and including
        a data driver adapted to load digital data in response to a phase-adjusted clock-load signal and send the digital data in response to a clock-load signal, and
        a clock-load circuit adapted to provide the clock-load signal and the phase-adjusted clock-load signal, the clock-load signal having phases that are adjusted relative to misalignment between the clock-load signal and the reference clock signal,
        wherein the transmit-data module further includes a clock source adapted to provide a fast-clock signal having a clock rate and related period, the fast-clock signal being used by the clock-load circuit to adjust the phases of the clock-load signal by delaying the clock-load signal as a function of the related period of the fast-clock signal,
        wherein the clock-load circuit is further adapted to adjust the phase of the clock-load signal by delaying the clock-load signal for one period of the fast-clock signal for each cycle of the reference clock signal when the reference clock signal and the clock-load signal are misaligned.

2. The circuit arrangement of claim 1, wherein for each of the multiple serial links, the circuit arrangement further includes a receive-data module communicatively coupled to the transmit-data module, the receive-data module being adapted to receive the digital data sent over a respective one of the serial links.

3. The circuit arrangement of claim 1, wherein the circuit arrangement further includes a programmable logic fabric and a plurality of programmable transceivers that are controlled by the programmable logic fabric, each programmable transceiver including one of the transmit-data modules.

4. For sending digital data representing a data set, using multiple serial links, a circuit arrangement for aligning the phases of the digital data at a transmission end of the multiple serial links, comprising:
    a reference clock signal;
    a plurality of transmit-data modules communicatively coupled to the reference clock signal;
    wherein each transmit-data module is communicatively coupled to a respective one of the multiple serial links for transmitting digital data and includes
        a data driver adapted to serially send the digital data in response to an input clock signal and parallel load the digital data in response to a clock-load signal,
        a clock-divider circuit adapted to provide the clock-load signal in response to the input clock signal,
        a phase-control circuit adapted to provide the clock-load signal with phases that are adjusted relative to misalignment between the clock-load signal and the reference clock signal, and
        a phase-adjustment clock adapted to provide a fast-clock signal having a clock rate and related period, the fast-clock signal being used by the phase-control circuit to adjust the phases of the clock-load signal by delaying the clock-load signal as a function of the related period of the fast-clock signal,
        wherein the phase-control circuit is further adapted to adjust the phase of the clock-load signal by delaying the clock-load signal for one period of the fast-clock signal for each cycle of the reference clock signal when the reference clock signal and the clock-load signal are misaligned.

5. The circuit arrangement of claim 4, wherein the phase-control circuit and the clock-divider circuit are adapted to suspend operation of the clock-divider circuit for at least one cycle of the input clock signal in response to the reference clock signal and the clock-load signal being misaligned.

6. The circuit arrangement of claim 4, wherein the phase-control circuit is further adapted to phase compare the reference clock signal and the clock-load signal and, in response thereto, indicate whether the reference clock signal and the clock-load signal are misaligned.

7. The circuit arrangement of claim 4, wherein the phase-control circuit includes a phase-comparison circuit that is adapted to phase compare the reference clock signal and the clock-load signal and indicate whether the reference clock signal and the clock-load signal are misaligned.

8. The circuit arrangement of claim 7, wherein the phase-control circuit and the clock-divider circuit are further adapted to suspend operation of the clock-divider circuit for at least one cycle of the input clock signal by providing an enable/disable signal to which the clock-divider circuit responds.

9. The circuit arrangement of claim 4, wherein the phase-control circuit and the clock-divider circuit are further adapted to phase compare the reference clock signal and the clock-load signal and, in response to a misalignment therebetween, suspend operation of the clock-divider circuit for one cycle of the input clock signal for each cycle of the reference clock signal when the reference clock signal and the clock-load signal are misaligned.

10. The circuit arrangement of claim 4, wherein the transmit-data module is further adapted to provide phase-alignment of the digital data with an accuracy that is within one cycle of the input clock signal.

11. For sending digital data representing a data set, using multiple serial links, a circuit arrangement for aligning the phases of the digital data at a transmission end of the multiple serial links, comprising:
    a reference clock signal;

at each of the multiple serial links, means communicatively coupled to the reference clock signal and for serially sending the digital data in response to a clock-output signal and parallel loading the digital data in response to a clock-load signal, providing the clock-load signal, providing a fast-clock signal having a clock rate and related period, the fast-clock signal used for adjusting the phases of the clock-load signal by delaying the clock-load signal as a function of the related period of the fast-clock signal, adjusting the phase of the clock-load signal relative to the reference clock signal by delaying the clock-load signal for one period of the fast-clock signal for each cycle of the reference clock signal when the reference clock signal and the clock-load signal are misaligned, and phase aligning the digital data for transmission over the multiple serial links.

12. For sending digital data representing a data set, using multiple serial links, a circuit arrangement for aligning the phases of the digital data at a transmission end of the multiple serial links, comprising:

a reference clock signal;

at each of the multiple serial links, a transmit-data module communicatively coupled to the reference clock signal and including means for serially sending the digital data from the transmit-data module in response to an input clock signal, means for parallel loading the digital data into the transmit-data module in response to a clock-load signal, means for providing a fast-clock signal having a clock rate and related period, the fast-clock signal being used to adjust the phases of the clock-load signal by delaying the clock-load signal as a function of the related period of the fast-clock signal, means for phase aligning the digital data by adjusting the phases of the clock-load signal, and means for adjusting the phases of the clock-load signal by delaying the clock-load signal for one period of the fast-clock signal for each cycle of the reference clock signal when the reference clock signal and the clock-load signal are misaligned.

* * * * *